(12) United States Patent
Bayat et al.

(10) Patent No.: US 11,170,839 B2
(45) Date of Patent: Nov. 9, 2021

(54) PROGRAMMING NON-VOLATILE MEMORY ARRAYS WITH AUTOMATIC PROGRAMMING PULSE AMPLITUDE ADJUSTMENT USING CURRENT-LIMITING CIRCUITS

(71) Applicant: MENTIUM TECHNOLOGIES INC., Santa Barbara, CA (US)

(72) Inventors: Farnood Merrikh Bayat, Santa Barbara, CA (US); Jaroslaw Sulima, Santa Barbara, CA (US); Mirko Prezioso, Santa Barbara, CA (US)

(73) Assignee: MENTIUM TECHNOLOGIES INC., Santa Barbara, CA (US)

( * ) Notice: Subject to any disclaimer, the term of this patent is extended or adjusted under 35 U.S.C. 154(b) by 0 days.

(21) Appl. No.: 16/932,266

(22) Filed: Jul. 17, 2020

(65) Prior Publication Data
US 2021/0020209 A1   Jan. 21, 2021

Related U.S. Application Data

(60) Provisional application No. 62/875,066, filed on Jul. 17, 2019.

(51) Int. Cl.
*G11C 11/40* (2006.01)
*G11C 11/406* (2006.01)
(Continued)

(52) U.S. Cl.
CPC .... *G11C 11/40626* (2013.01); *G01R 19/0038* (2013.01); *G01R 19/10* (2013.01);
(Continued)

(58) Field of Classification Search
CPC .......... G11C 11/40626; G11C 11/4094; G11C 11/4097; G11C 7/1096; G11C 11/4074; G11C 5/025; G11C 11/4091; G11C 11/4093; G11C 7/16; G11C 2216/04; G11C 16/3418; G11C 16/30; G11C 16/08;
(Continued)

(56) References Cited

U.S. PATENT DOCUMENTS 6,687,165 B1   2/2004 Cioaca
6,813,194 B2   11/2004 Tran et al.
(Continued)

OTHER PUBLICATIONS

PCT International Search Report and Written Opinion issued in corresponding Application No. PCT/US2020/042666, dated Nov. 20, 2020.
(Continued)

*Primary Examiner* — Ajay Ojha
(74) *Attorney, Agent, or Firm* — Maschoff Brennan

(57) ABSTRACT

A system for programming memory devices in an array is provided. The system may include a plurality of memory cells that are organized into an array having two or more rows of memory cells arranged horizontally and two or more columns of memory cells arranged vertically. The system may also include a current-compliance circuit that is electrically coupled to one or more memory cells in the plurality of memory cells. The current-compliance circuit may be configured to limit an amount of current supplied to the one or more memory cells during a programming phase of the one or more memory cells.

18 Claims, 3 Drawing Sheets

(51) Int. Cl.
*G11C 11/4074* (2006.01)
*G11C 5/02* (2006.01)
*G11C 11/4091* (2006.01)
*G11C 11/4093* (2006.01)
*G01R 19/00* (2006.01)
*G01R 19/10* (2006.01)
*G05F 1/56* (2006.01)
*G05F 1/575* (2006.01)
*G11C 7/10* (2006.01)
*G11C 11/4094* (2006.01)
*G11C 11/4097* (2006.01)
*H03K 17/22* (2006.01)

(52) U.S. Cl.
CPC .............. *G05F 1/561* (2013.01); *G05F 1/575* (2013.01); *G11C 5/025* (2013.01); *G11C 7/1096* (2013.01); *G11C 11/4074* (2013.01); *G11C 11/4091* (2013.01); *G11C 11/4093* (2013.01); *G11C 11/4094* (2013.01); *G11C 11/4097* (2013.01); *H03K 17/22* (2013.01)

(58) Field of Classification Search
CPC .. G11C 8/08; G11C 5/147; G11C 7/04; H03K 17/22; G01R 19/0038; G01R 19/10; G05F 1/561; G05F 1/575
See application file for complete search history.

(56) References Cited

U.S. PATENT DOCUMENTS

| | | | |
|---|---|---|---|
| 8,547,756 | B2 | 10/2013 | Widjaja et al. |
| 9,419,596 | B2 | 8/2016 | Yang et al. |
| 9,997,236 | B1* | 6/2018 | Pathak ..................... G11C 7/04 |
| 2006/0119496 | A1 | 6/2006 | Tester et al. |
| 2010/0158055 | A1 | 6/2010 | Giebel |
| 2019/0115077 | A1 | 4/2019 | Shin et al. |
| 2020/0090713 | A1* | 3/2020 | Joo ..................... G11C 11/4094 |

OTHER PUBLICATIONS

Non-Final Office Action issued in corresponding U.S. Appl. No. 16/932,258, dated Oct. 7, 2020.

* cited by examiner

PROGRAMMING NON-VOLATILE MEMORY ARRAYS WITH AUTOMATIC PROGRAMMING PULSE AMPLITUDE ADJUSTMENT USING CURRENT-LIMITING CIRCUITS

CROSS-REFERENCE TO A RELATED APPLICATION

This patent application claims the benefit of and priority to U.S. Provisional Application No. 62/875,066 filed Jul. 17, 2019, which is incorporated herein by reference.

BACKGROUND

Compared to regular and volatile memories like SRAM, non-volatile memory arrays have the advantage that they can retain their states for several years without the need for refreshing of states. However, in order to be able to use these memory arrays in any sort of applications, individual memory cells within the array need to be programmed with predetermined data. If the non-volatile memory (NVM) is used in digital applications, for example to store binary data, the NVM cells will be programmed to a binary state where each state will represent one of the binary values. The same memory array can also be used in another type of application known as in-memory computation used for the implementation of deep neural networks and machine learning algorithms in which each memory cell will store analog values corresponding to neural network parameters. In this case, the same exact device storing network parameters will later be used to perform analog in-memory computations such as vector-by-matrix multiplication, or dot-product. In any of these cases, analog or digital programming of NVM devices is usually done through the application of a sequence of narrow pulses (e.g. 10 ns-10 ms) with amplitudes higher than those used for normal operation of the array (e.g. 3-12V for flash memory array and 1-5 v for resistive switching memory arrays). Depending on the structure and functionality of the device, these high-voltage pulses may be applied to a single or multiple terminals of the NVM cells with carefully adjusted timings. If NVM memory cells are arranged in rows and columns creating an array, these pulses may be applied to common rows and columns of the array which will be seen by all the cells connected to that rows or columns. Application of these high-voltage pulses may result in high currents passing through these NVM cells. Inability to limit this current properly may degrade the endurance of the device and lower the accuracy of analog programming of these memory cells.

The subject matter claimed in the present disclosure is not limited to embodiments that solve any disadvantages or that operate only in environments such as those described above. Rather, this background is only provided to illustrate one example technology area where some embodiments described in the present disclosure may be practiced.

SUMMARY

In one embodiment, a system for programming memory devices in an array is provided. The system may include a plurality of memory cells that are organized into an array having two or more rows of memory cells arranged horizontally and two or more columns of memory cells arranged vertically. The system may also include a current-compliance circuit that is electrically coupled to one or more memory cells in the plurality of memory cells. The current-compliance circuit may be configured to limit an amount of current supplied to the one or more memory cells during a programming phase of the one or more memory cells.

In some embodiments, the memory cells may be non-volatile memory cells.

In some embodiments, the current-compliance circuit may consist of passive devices including resistors.

In some embodiments, the current-compliance circuit may consist of active devices including FET transistors.

In some embodiments, the current-compliance circuit may limit the amount of current supplied to the one or more memory cells during the programming phase by varying the amount of current supplied to the one or more memory cells during different stages of the programming phase. For example, the current-compliance circuit may allow a first smaller amount of current to be supplied to the one or more memory cells during an earlier stage of the programming phase and a second larger amount of current to be supplied to the one or more memory cells during a later stage of the programming phase.

In some embodiments, the current supplied to the one or more memory cells during the programming phase of the one or more memory cells may be a fixed maximum current.

In some embodiments, the system may include a pulse generator that is configured to generate the current supplied to the one or more memory cells during the programming phase of the one or more memory cells. The current-compliance circuit may be positioned between the pulse generator and the one or more memory cells.

In some embodiments, the one or more cells to which the current-compliance circuit is coupled are in the same column within the array.

In some embodiments, the one or more cells to which the current-compliance circuit is coupled are in the same row within the array.

In another embodiment, a system for programming memory devices in an array is provided. The system may include a plurality of memory cells organized in an array having a first row of two or more electrically coupled memory cells arranged horizontally and a second row of two or more electrically coupled memory cells arranged horizontally. The system may also include a first current-compliance circuit that is electrically coupled to the first row of two or more memory cells. The first current-compliance circuit may be configured to limit the amount of current supplied to the two or more memory cells in the first row during a programming phase by varying an amount of current supplied to the two or more memory cells in the first row during different stages of the programming phase. The system may further include a second current-compliance circuit that is electrically coupled to the second row of two or more memory cells. The second current-compliance circuit may be configured to limit the amount of current supplied to the two or more memory cells in the second row during a programming phase by varying an amount of current supplied to the two or more memory cells in the second row during different stages of the programming phase.

In another embodiment, a system for programming memory devices in an array is provided. The system may include a plurality of memory cells organized into an array having two or more rows of memory cells arranged horizontally and two or more columns of memory cells arranged vertically. The system may also include a current-compliance circuit that is electrically coupled to one or more memory cells in the plurality of memory cells. The current-compliance circuit may be configured to limit an amount of current supplied to the one or more memory cells during a programming phase of the one or more memory cells to a fixed maximum current. The system may further include a pulse generator that is configured to generate the current supplied to the one or more memory cells during the programming phase of the one or more memory cells. The current-compliance circuit may be positioned between the pulse generator and the one or more memory cells The object and advantages of the embodiments will be realized and achieved at least by the elements, features, and combinations particularly pointed out in the claims. Both the foregoing summary and the following detailed description are exemplary and explanatory and are not restrictive of the invention as claimed.

BRIEF DESCRIPTION OF THE DRAWINGS

Example embodiments will be described and explained with additional specificity and detail through the use of the accompanying drawings in which.

DETAILED DESCRIPTION

Figure 1A:
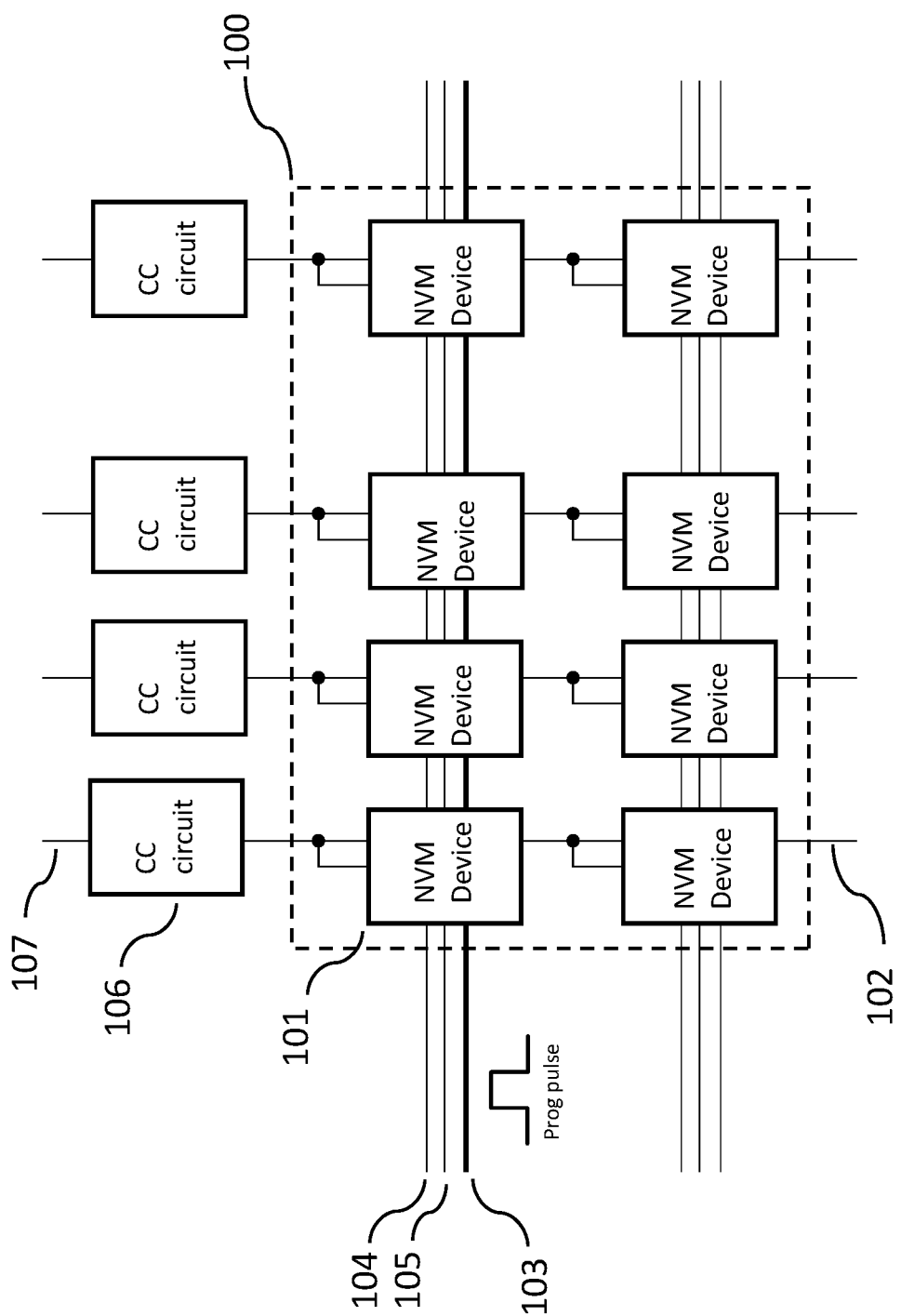
FIG. 1A illustrates an example environment in which current-compliance circuits may be implemented in NVM memory arrays.

One or more embodiments of the present disclosure may include a system. The system may include a single or multiple memory arrays and may be used in operation or programming phase. The memory array may be configured to be used for digital or analog data storage or in-memory computing such as vector by matrix multiplication (VMM). The memory array may include a matrix of devices. Each device of the matrix of devices may be configured to receive a sequence of programming signals or pulses. Each device may retain its state until the new set of programming signals or pulses are applied. The programming signals may be used to program a single or multiple bits of information, which may cause the memory array to store digital data. In other embodiments, the programming signals may be used to program a weight of the corresponding device, which may cause the memory array to store a matrix of weights.

Each device may have two or more terminals used differently in programming and operation modes. Each device of the matrix of devices may also be configured to receive other digital or analog input signals on its terminals which may have different values in operating and programming modes. In each matrix of devices, devices located on the same rows or columns may share one or more terminals and may be read or get programmed in parallel. A large current may pass through devices getting programmed due to the application of programming signals or pulses.

The system may also include multiple Current-Compliance (CC) circuits. Each CC circuit may be electrically coupled to a corresponding device or common rows or columns of a matrix of devices. In addition, each CC may be configured to limit the corresponding current passing through the circuit. Each CC circuit may have multiple inputs by which the amplitude of the current which can pass through the circuit can be adjusted. Each CC circuit may be disconnected from the matrix of devices in the operation mode.

In some embodiments, a system may include one or more non-volatile memory arrays. In some systems, the memory arrays may be used to work as memory to store digital or analog data. In some other systems, the memory array may store analog parameters and may be used for in-memory computation. In memory arrays, there may be peripheral circuitries such as charge pump, pulse generator, buffers, row and column decoders which may be used to select and read or program one or more rows and columns for devices. In some memory arrays, devices in the memory array may be weighted or programmed with an analog or digital values by applying a sequence of pulses to device terminals (with properly adjusted amplitude). In addition, in some memory arrays, there may be current-compliance circuits connected to the rows and/or columns of the memory array. The current-compliance circuits may be used during programming to limit the maximum current passing through the devices being programmed.

In some embodiments, proper voltages or currents may be applied to terminals of the memory array to allow parallel programming of multiple devices in the array.

In some embodiments, proper voltages or currents may be applied to terminals of the memory array to avoid unselected devices in the array from getting programmed.

In some embodiments, the CC circuit is connected to the terminal of the array to which the programming pulse may be applied. In other embodiments, the CC circuit may be connected to other terminals of the array from which the programming current may pass.

In some embodiments, the CC circuits may limit the current of an individual device inside the array selected to be programmed. In other embodiments, the CC circuit may limit the accumulative currents of devices being programmed in parallel.

In some embodiments, the memory array may include non-volatile memory device. For example, the memory array may include a flash memory device, a memristive memory device, a phase change memory (PCM) device, etc.

In some embodiments, the CC circuit may consist of passive devices like resistors. In some other embodiments, the CC circuit may consist of active devices like FET transistors where the channel conductance is adjusted by the voltage applied to the gate.

Some embodiments described in the present disclosure may permit the CC circuit to limit the maximum current which may pass the selected devices being programmed. The CC may reduce the amplitude of the programming pulses to reduce the maximum current passing through the NVM devices at the beginning. With the devices getting more and more programmed, the CC circuit may allow larger and larger programming pulses to be applied to the selected NVM devices being programmed.

In some embodiments, the CC circuit may allow a fixed maximum current to pass through during the whole programming phase. In some other embodiments, the biasing condition and the maximum current the CC circuit passes may be varied and adjusted during the programming phase to allow less or more current or smaller or larger programming pulses to pass.

These and other embodiments of the present disclosure will be explained with reference to the accompanying figures. In the figures, features with like numbers indicate like structure and function unless described otherwise.

FIG. 1A illustrates an example environment in which a CC circuit 106 may be implemented, in accordance with at least one embodiment described in the present disclosure. The environment may include matrix of NVM devices 100.

The matrix of NVM devices 100 may consist of rows and columns of NVM devices 101. The memory array may store binary data or a matrix of weights. The memory array may include two terminal devices or devices with more than two terminals. The memory array may include a flash memory array, a memristor memory array, or any other appropriate memory array. Memory devices located on the same column within the memory array may share a common terminal 102. In addition, memory devices located on the same row within the memory array may share one or multiple common terminals 103, 104, and 105. The memory array 100 may include any number of devices 101 in each row or column, for example, thousands or more devices 101. In addition, the memory array 100 may include a two-dimensional or three-dimensional matrix of devices 101.

The devices 101 may form a matrix configured to receive a sequence of programming pulses signals (e.g., programming signals) at device terminals (e.g. gates, drain and source) with properly adjusted amplitude to store a weight value. In some embodiments, a device state (e.g., the weight of the devices 101) may be measured. If the device state is not within a target state, another programming pulse may be applied to the devices 101. In some embodiments, the weight value may include a positive value or a negative value. In addition, in some embodiments, the weight values stored on the devices 101 may include an analog value or a digital value. In some embodiments, the gate of the devices 101 may include a floating gate.

In some embodiments, the devices 101 may include transistors configured to store bits of data as a charge, for example, on floating gate transistors. The devices 101 may include single-level cell (SLC) devices. Additionally or alternatively, the devices 101 may include multi-level cell (MLC), triple-level cell (TLC) or quad-level cell (QLC) devices. In some embodiments, the memory array 100 may be used to perform neural network operations (e.g., the memory array 100 may be used in read mode to execute functionality of synapses of the neural network like vector by matrix multiplication).

In some embodiments, multiple devices 101 one a single row or column may be programmed in parallel. The sequence of programming pulses applied to the programming terminal 103 of the selected row and the biasing voltages or current applied to other terminals of the devices 102, 104, 105 may be seen by all devices electrically coupled to the same terminals. Devices 101 electrically coupled to the terminal receiving the sequence of programming pulses may be programmed in parallel.

In some embodiments, some devices 101 on one row or column of the array getting programmed in parallel may be stopped from being programmed more by applying proper voltages or current to uncommon terminals (for example terminals 102 in FIG. 2A). In some other embodiments, the same process may be applied to avoid devices in unselected rows and columns from getting programmed.

During the programming of the NVM devices 101 in memory array 100, the speed and amount of programming happening in selected devices may depend on the type of NVM device and the voltages or currents applied to other terminals of the memory devices 102, 103, 104, and 105.

In some embodiments, a CC circuit 106 may be added to the memory array during the programming phase to limit the current passing through each of the device 101 which are being programmed in parallel to extend device endurance and lifetime. The CC may reduce the power consumed to program the devices 101 and may reduce the area of the charge pump needed to generate the sequence of programming pulses. With the usage of the CC circuit, the biasing of the array terminal 102 may be provided by the voltage applied to terminal 107.

In some embodiments, the CC circuit may also be used for analog programming of NVM devices 101 by limiting the amount of change in device conductance per each applied programming pulse. In these embodiments, the CC circuit may make the change in device conductance due to the programming pulse independent of the pulse amplitude.

In other embodiments, the CC may be used to change and adjust the speed of programming in devices 101 which are getting programmed. Allowing more current to pass may result in faster and coarser NVM device programming while reducing the current may yield to slower but more accurate NVM device programming. In addition, the CC circuit may be used to get uniform gradual programming in multiple devices with device-to-device mismatch when they are getting programmed in parallel.

The CC circuits 106 may be controlled together or individually.

The memory array 100 may be used as a memory or for implementing other applications like in-memory computation in operation or read mode without the CC circuits 106 by applying proper inputs from input sources to some terminals of the array (e.g. 104 and 105) and reading currents from other terminals (e.g. 102) while other terminals are biased with proper voltages (e.g. setting 103 to GND).

Although not shown in FIG. 1A, there may be other peripheral blocks around the memory array necessary for the proper operation of the block like row and column decoders, sense amplifiers, pulse generator, low-voltage and high-voltage decoders, charge pump, etc.

In some embodiment, the CC circuit may include a passive resistor. In other embodiments, a single FET transistor may be used to limit the current passing between terminals 102 and 107 where the current allowed to flow through the FET channel is set by the voltage applied to the gate of the FET transistor.

Figure 1B:
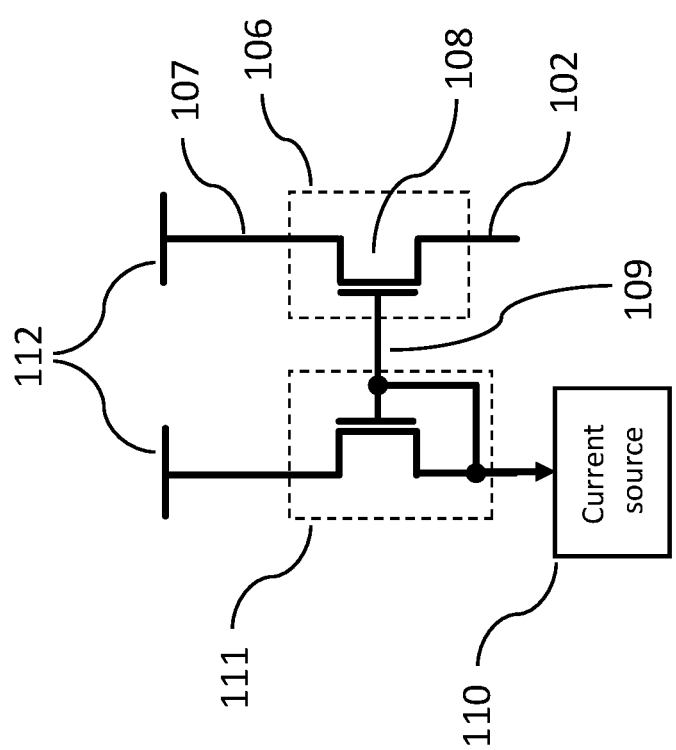
FIG. 1B illustrates an example of a current-compliance circuit that may be implemented in the environment illustrated in FIG. 1.

FIG. 1B illustrates an example of CC circuit 106 that may be implemented in the environment of FIG. 1, in accordance with at least one embodiment described in the present disclosure. The FET transistor 108 may be used as a CC to limit the current passing through a selected NVM device in the memory array 100 by limiting the current passing through terminals 102 and 107. Voltage 112 may be applied to terminal 107 to bias the NVM devices in the memory array during programming. The current allowed to pass through the CC FET transistor 108 may be determined by the voltage applied to the gate 109 of the FET transistor 108. The voltage of the FET gate 109 may be generated with a diode-connected transistor 111 derived by the current source 110 which may limit the maximum current of the FET 108 to be equal to the current produced by the current source 110.

In some embodiments, the diode-connected FET transistor 111 may be shared between multiple CC circuits 106. In some other embodiments, the current generated by current source 110 may be adjusted during the time a sequence of pulses is being applied to the memory array 100.

Figure 2:
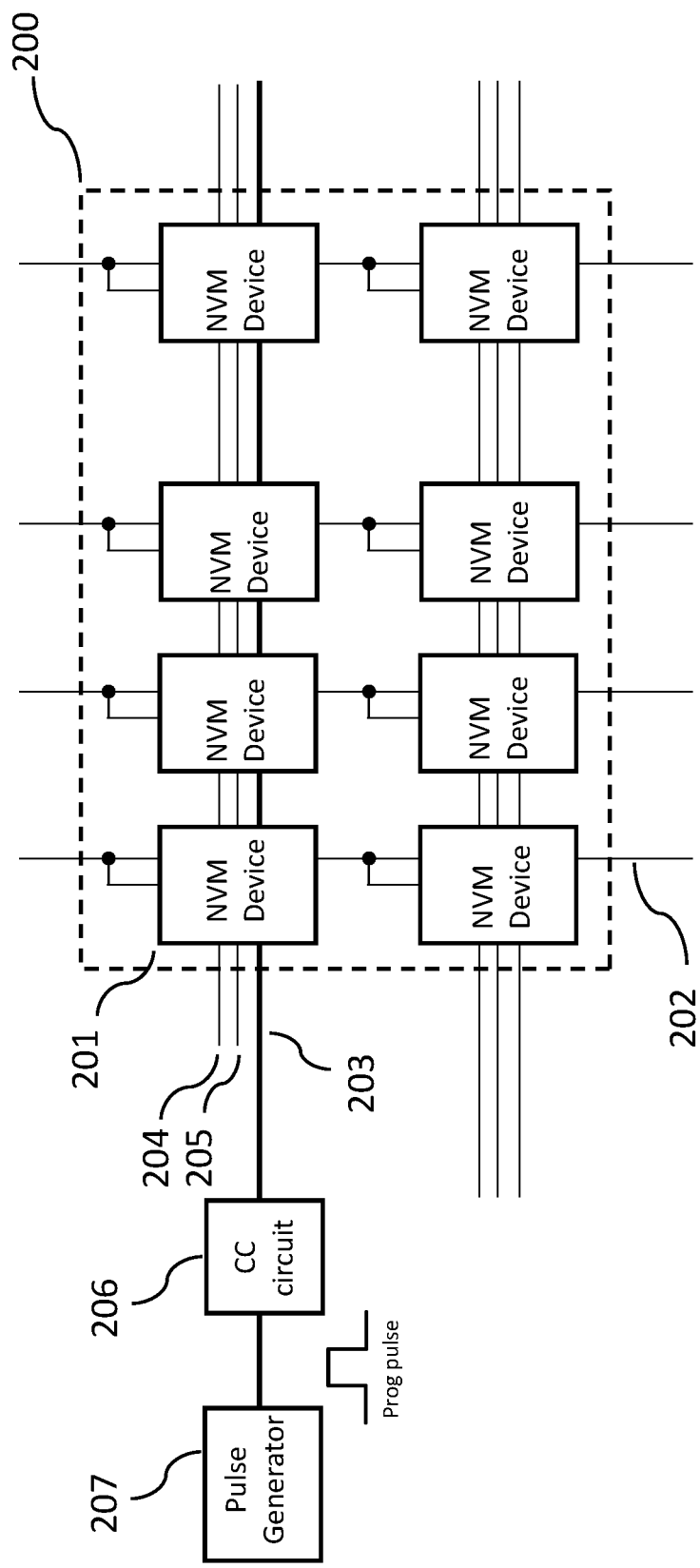
FIG. 2 illustrates another example environment in which current-compliance circuits may be implemented in NVM memory arrays.

FIG. 2 illustrates another example of how the CC circuit may be used in memory array to limit the current passing through NVM devices during parallel programming. Memory array 200 may correspond to the memory array 100 in FIG. 1A. Memory device 201 may correspond to the memory device 101 in FIG. 1A. In addition, memory array terminals 202, 203, 204 and 205 may respectively correspond to the memory array terminals 102, 103, 104, and 105 in FIG. 1A.

The CC circuit 206 may be placed between the memory array 200 and the pulse generator 207 generating the sequence of programming pulse used to program NVM devices 201. The CC circuit 206 may limit the sum of currents of the selected NVM devices 201 located on the same row that the sequence of programming pulse is being applied. The NVM devices 201 on the selected row may be avoided from further programming by applying proper voltage to terminals 202.

In some embodiments, the pulse generator circuit 207 and the CC circuit 206 may be shared between multiple rows to reduce chip area. In some other embodiments, there may be other peripheral circuitry like row decoder located between the CC circuit and the memory array. In another embodiments, the row decoder and CC may be merged into a single circuit.

When used to limit the current of multiple devices during programming, the current of CC circuit may mostly pass through NVM devices 201 with lower threshold voltage, program them more than other devices and increase their threshold voltages. The same process may get repeated when the subsequent programming pulses are getting applied to the memory array 200.

When more and more selected devices 201 get programmed with the sequence of programming pulses, the sum of current passing through the CC circuit may decrease resulting in a reduction of the voltage dropped on the CC circuit. Having smaller drop on the CC circuit may increase the amplitude of the pulse seen by the NVM memory devices 201 which may increase the programming speed. In this positive feedback, the amplitude of the programming pulses seen by internal NVM devices 201 may be automatically adjusted and increased when devices being programmed in parallel get more and more programmed. The CC circuit 206 may automatically account for the problem of device-to-device variations between NVM memory devices 201 during the programming phase.

In accordance with common practice, the various features illustrated in the drawings may not be drawn to scale. The illustrations presented in the present disclosure are not meant to be actual views of any particular apparatus (e.g., device, system, etc.) or method, but are merely example representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the summary, detailed description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

The foregoing description, for purpose of explanation, has been described with reference to specific embodiments. However, the illustrative discussions above are not intended to be exhaustive or to limit the invention as claimed to the precise forms disclosed. Many modifications and variations are possible in view of the above teachings. The embodiments were chosen and described to explain practical applications, to thereby enable others skilled in the art to utilize the invention as claimed and various embodiments with various modifications as may be suited to the particular use contemplated.

The invention claimed is:

1. A system for programming memory devices in an array, the system comprising:
    a plurality of memory cells organized into an array having two or more rows of memory cells arranged horizontally and two or more columns of memory cells arranged vertically; and a current-compliance circuit electrically coupled to one or more memory cells in the plurality of memory cells, wherein the current-compliance circuit is configured to limit an amount of current supplied to the one or more memory cells during a programming phase of the one or more memory cells by varying the amount of current supplied to the one or more memory cells during different stages of the programming phase, wherein the current-compliance circuit:
  allows a first smaller amount of current to be supplied to the one or more memory cells during an earlier stage of the programming phase; and
  allows a second larger amount of current to be supplied to the one or more memory cells during a later stage of the programming phase.

2. The system of claim 1, wherein the memory cells are non-volatile memory cells.

3. The system of claim 1, wherein the current-compliance circuit consists of passive devices including resistors.

4. The system of claim 1, wherein the current-compliance circuit consists of active devices including FET transistors.

5. The system of claim 1, wherein the current supplied to the one or more memory cells during the programming phase of the one or more memory cells is a fixed maximum current.

6. The system of claim 1, further comprising a pulse generator configured to generate the current supplied to the one or more memory cells during the programming phase of the one or more memory cells, wherein the current-compliance circuit is positioned between the pulse generator and the one or more memory cells.

7. The system of claim 1, wherein the one or more cells to which the current-compliance circuit is coupled are in the same column within the array.

8. The system of claim 1, wherein the one or more cells to which the current-compliance circuit is coupled are in the same row within the array.

9. A system for programming memory devices in an array, the system comprising:
  a plurality of memory cells organized in an array having a first row of two or more electrically coupled memory cells arranged horizontally and a second row of two or more electrically coupled memory cells arranged horizontally;
  a first current-compliance circuit electrically coupled to the first row of two or more memory cells, wherein the first current-compliance circuit is configured to limit the amount of current supplied to the two or more memory cells in the first row during a programming phase by varying an amount of current supplied to the two or more memory cells in the first row during different stages of the programming phase; and
  a second current-compliance circuit electrically coupled to the second row of two or more memory cells, wherein the second current-compliance circuit is configured to limit the amount of current supplied to the two or more memory cells in the second row during a programming phase by varying an amount of current supplied to the two or more memory cells in the second row during different stages of the programming phase.

10. The system of claim 9, wherein the memory cells are non-volatile memory cells.

11. The system of claim 9, wherein the first and second current-compliance circuits consists of passive devices including resistors.

12. The system of claim 9, wherein the first and second current-compliance circuits consists of active devices including FET transistors.

13. The system of claim 9, wherein the first current-compliance circuit allows a first smaller amount of current to be supplied to the two or more memory cells in the first row during an earlier stage of the programming phase and allows a second larger amount of current to be supplied to the two or more memory cells in the first row during a later stage of the programming phase.

14. The system of claim 9, further comprising:
  a first pulse generator configured to generate the current supplied to the two or more memory cells in the first row during the programming phase, wherein the first current-compliance circuit is positioned between the first pulse generator and the two or more memory cells in the first row; and
  a second pulse generator configured to generate the current supplied to the two or more memory cells in the second row during the programming phase, wherein the second current-compliance circuit is positioned between the second pulse generator and the two or more memory cells in the second row.

15. A system for programming memory devices in an array, the system comprising:
  a plurality of memory cells organized into an array having two or more rows of memory cells arranged horizontally and two or more columns of memory cells arranged vertically;
  a current-compliance circuit electrically coupled to one or more memory cells in the plurality of memory cells, wherein the current-compliance circuit is configured to limit an amount of current supplied to the one or more memory cells during a programming phase of the one or more memory cells to a fixed maximum current; and
  a pulse generator configured to generate the current supplied to the one or more memory cells during the programming phase of the one or more memory cells, wherein the current-compliance circuit is positioned between the pulse generator and the one or more memory cells.

16. The system of claim 15, wherein the memory cells are non-volatile memory cells.

17. The system of claim 15, wherein the one or more cells to which the current-compliance circuit is coupled are in the same column within the array.

18. The system of claim 15, wherein the one or more cells to which the current-compliance circuit is coupled are in the same row within the array.

* * * * *